United States Patent [19]

Maloney et al.

[11] Patent Number: 5,160,545
[45] Date of Patent: Nov. 3, 1992

[54] METHOD AND APPARATUS FOR EPITAXIAL DEPOSITION

[75] Inventors: James R. Maloney, San Jose; Joseph C. Moore, Milpitas, both of Calif.

[73] Assignee: Applied Materials, Inc., Santa Clara, Calif.

[21] Appl. No.: 767,526

[22] Filed: Sep. 26, 1991

Related U.S. Application Data

[63] Continuation of Ser. No. 306,376, Feb. 3, 1989, abandoned.

[51] Int. Cl.$^5$ .............................................. C23C 16/00
[52] U.S. Cl. ..................................... 118/725; 118/724; 118/730
[58] Field of Search ................ 118/715, 724, 725, 730

[56] References Cited

U.S. PATENT DOCUMENTS 4,836,138  6/1989  Robinson ............................ 118/725

FOREIGN PATENT DOCUMENTS 61-86497  5/1986  Japan ................................ 118/715

Primary Examiner—Richard Bueker
Attorney, Agent, or Firm—Robert Stoddard

[57] ABSTRACT

The cooling air flow path extends from a blower through a tapered input duct to a large plenum chamber which coaxially surounds and extends over the top of the deposition apparatus. From this plenum chamber cooling air flows coaxially downward over the surface of the quartz bell jar which forms the reaction chamber, and radially inward through the banks of radiant heater lamps coaxially surrounding the bell jar. Each bank of heater lamps is readily removed for servicing by being rotated into an open position about a pivot axis extending along one vertical edge. From the open position, the bank can be slid sideways in slots in the supports and removed from the apparatus.

15 Claims, 5 Drawing Sheets

METHOD AND APPARATUS FOR EPITAXIAL DEPOSITION

This application is a continuation of application Ser. No. 07/306,376, filed Feb. 03, 1989 now abandoned.

BACKGROUND OF THE INVENTION

The present invention relates generally to the field of silicon wafer fabrication equipment useful in the manufacture of semiconductor devices, more particularly to apparatus for depositing an epitaxial layer from a source gas by the chemical vapor deposition (CVD) method, and especially to improvements in the cooling and ease of servicing of such equipment.

Apparatus of the above type is used in the fabrication of semiconductor devices on 100 millimeter or larger wafers of silicon. Epitaxial layers are formed on the surfaces of the wafers by heating them to temperatures in the region of 1100 to 1200 degrees Celsius in a bell jar containing a gaseous atmosphere consisting of a hydrogen carrier gas mixed with one or more reactive gases such as a silicon source gas or a dopant source gas.

The CVD process is highly temperature sensitive, such that producing the required high quality epitaxial layers on the surfaces of the wafers while avoiding deposition on the walls of the bell jar requires that the wafers be uniformly heated to a precise temperature while the remainder of the apparatus is maintained at a temperature well below that at which the CVD reaction will occur.

The required heating of the wafers is accomplished by inductively heating the graphite susceptor on which the wafers are supported or by radiant heating with a large array of heating lamps surrounding the bell jar, while an air cooling system cools the walls of the bell jar.

DESCRIPTION OF THE PRIOR ART

In one known type of epitaxial deposition system which is used in the Model 7800 Epitaxial Reactor manufactured by Applied Materials of Santa Clara, Calif., silicon wafers are supported in a spaced array extending over the surface of a vertically elongated graphite susceptor of polygonal cross-section. A cylindrical quartz bell jar coaxially surrounds the susceptor and confines the required gaseous atmosphere. A large array of heating lamps coaxially surrounds the bell jar over most of its vertical extent to radiantly heat the susceptor and wafers. The susceptor and wafers are rotated during processing, such that the gaseous atmosphere is continuously mixed and heating is uniform.

In order to avoid raising the temperature of the quartz bell jar sufficiently to cause unwanted deposition on the walls of the jar, an air-cooling system is provided. A centrifugal blower drives air along a closed-loop flow path extending from the blower output to the deposition apparatus and returning through an air-to-water heat exchanger to the blower input. In the region of the deposition apparatus, the flow path diverges into a first branch which coaxially envelops the bell jar and flows axially along its surface, and a second branch which passes through slots in the lamp arrays to cool the surfaces of the lamp reflectors.

While this prior-art deposition apparatus has performed very successfully, it could be further improved from two standpoints: (1) Access to the heating lamps for replacement could be made easier; and (2) The effectiveness of the cooling system could be increased by lowering air flow resistance and improving the uniformity of air flow.

With respect to the first of these considerations, the operator is required to assume a crouching position while unfastening the connections to one of the five banks of lamps, and then to reach forward and carefully maneuver the bank out of its position on the apparatus. Since each bank is heavy, and clearance with surrounding portions of the apparatus is close, the removal of a bank is somewhat difficult and tiring.

The design of the air cooling system of the prior art deposition apparatus could be improved by eliminating any complex and convoluted portions of the flow path, including any abrupt changes in the flow direction and cross section of the air flow path. In particular, each of the five banks of lamps of this prior-art apparatus is provided with a separate flow of air from a manifold. Providing more uniform and less restricted air flow to cool the heating lamps would promote a maximum service life with minimum maintenance.

SUMMARY OF THE INVENTION

An object of the present invention is to provide an epitaxial deposition apparatus having an improved air cooling system.

A further object of the present invention is to provide an epitaxial deposition apparatus of the type using radiant heating lamps wherein the accessibility of the heating lamps for servicing is improved.

A further object of the present invention is to provide an epitaxial deposition apparatus of the type using radiant heating lamps arranged in an array surrounding the epitaxial reaction chamber, wherein the lamp array is coaxially surrounded by an air plenum chamber.

A further object of the present invention is to provide an epitaxial deposition apparatus of the type using radiant heating lamps disposed in a plurality of banks, wherein each bank is pivotally supported on a pivot axis extending along one edge and is rotatable about said pivot axis to an open position away from its mounted position.

A further object of the present invention is to provide an epitaxial deposition apparatus according to the preceding object in which each lamp bank, once pivoted into its open position, can be translationally slid in a direction parallel to its plane for removal.

A further object of the present invention is to provide an epitaxial deposition apparatus in which the air-flow path is generally unidirectional.

To the above ends, an epitaxial deposition apparatus according to the present invention has a simplified flow path within which cooling air flows from a centrifugal blower through a smoothly tapered transition to a plenum chamber extending over the top and coaxially around the apparatus. From its entrance point near the top of this plenum chamber, cooling air flows axially downward in the coaxial space between the bell jar and the surrounding lamp array.

Lamp-array cooling air also flows downward in the portion of the plenum chamber coaxially surrounding the lamp array, radially inward through slots between the lamps, and axially downward over the surface of the bell jar. From the bottom of the deposition apparatus, air flows through a smoothly tapered transition to an air-to-water heat exchanger where it is cooled before returning to the blower inlet.

By providing a large plenum chamber extending completely around the outside of the lamp array, variations in pressure and flow rate of the air cooling the lamp array are avoided. Similarly, by providing a single air input near the top of the plenum chamber and a single air outlet coaxial with the lower end of the bell jar, air flow within the deposition apparatus is as nearly unidirectionally downward as possible.

The lamp array which coaxially surrounds the bell jar is formed of a plurality of banks in the form of vertically oriented panels, each containing as many as 15–20 linear, tubular halogen-quartz lamps in a spaced ladder-like array with the axis of each lamp horizontal. Each bank is supported by four trunnions, one trunnion being located at each of the four corners of the bank. An upper and a lower support plate are positioned to receive these trunnions in grooves in each support plate, and to support each bank in a mounted position on the apparatus.

For servicing or replacement of the lamps, each bank can be swung approximately 15 degrees away from its mounted position to an open position by being pivoted about a pivot axis extending along one vertical edge between a pair of trunnions. From this open position, the entire bank can be slid sideways along the grooves in the mounting plates and removed from the apparatus.

BRIEF DESCRIPTION OF THE DRAWINGS

The above and other features, objects and advantages of the present invention together with the best mode known to the inventors thereof for carrying out their invention will become clearer by reading the following detailed description of the invention while studying the associated drawing, the various figures of which represent.

DETAILED DESCRIPTION OF THE PRESENT INVENTION

Figure 1:
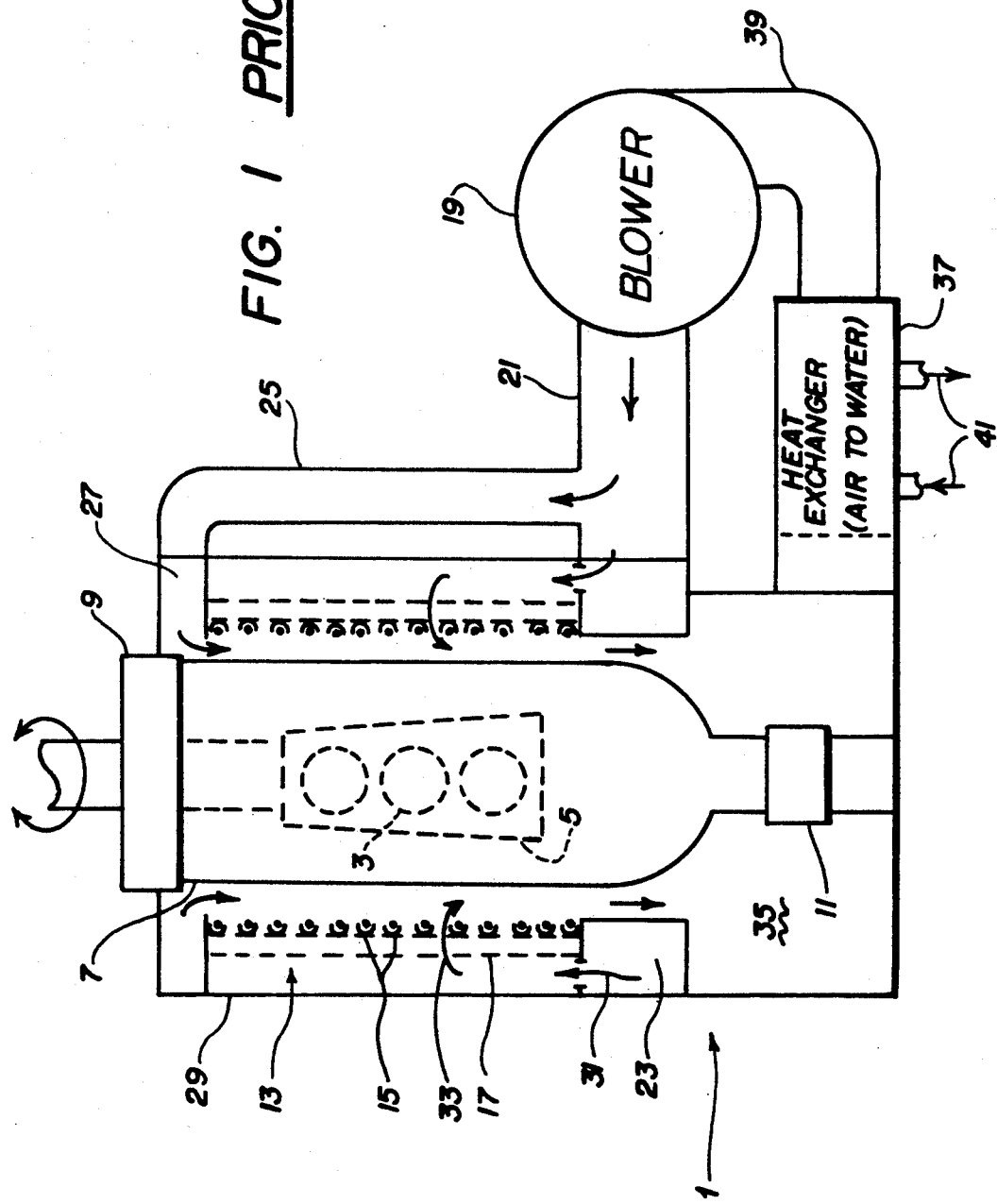
FIG. 1 is a cross-sectional view in schematic form of a prior-art epitaxial deposition apparatus.

FIG. 1 shows an epitaxial deposition apparatus 1 used for forming epitaxial layers on semiconductor substrates 3 mounted on a graphite susceptor 5 within a quartz bell jar 7. Apparatus 1 is of the prior-art type discussed earlier in this application as used in the aforementioned Applied Materials Model 7800 Epitaxial Reactor system.

Bell jar 7 is supported within apparatus 1 by an upper support 9 and a lower support 11, and is provided with ducts (not shown) for introducing a thermally activated reactive gas mixture to the interior of the bell jar during operation. As FIG. 1 suggests, bell jar 7 may desirably be shaped as a circular cylinder such that it possesses radial symmetry about its central axis.

Coaxially surrounding bell jar 7 is a distributed radiant heater 13 which uses a plurality of heating lamps 15, shown in cross-section, supported on a transversely air-permeable support frame 17. Lamps 15 may be linear, tubular halogen-quartz lamps capable of operation for long periods at temperatures in the region of 3000 degrees Kelvin.

Substrates 3 and susceptor 5 are heated to temperatures in the region of 1100 to 1200 degrees Celsius by heater 13 to cause the thermally activated reactive gas mixture in bell jar 7 to deposit the desired layer on the substrates. For example, such a reactive gas mixture might comprise trichlorosilane gas in a hydrogen carrier gas in order to deposit a silicon epitaxial layer on substrates 3.

In order that the epitaxial layer produced in apparatus 1 be of a desirably high quality and uniformity, the temperature of the substrates 3 must be uniformly raised to the precise temperature needed to activate the chemical vapor deposition (CVD) reaction. Such uniformity is provided by using a distributed heater which produces fairly uniform heating over a large area, by employing a coaxial geometry having radial symmetry, and by continuously rotating substrates 3 and susceptor 5 during processing. The rotation of the susceptor also serves to stir the reactive gas mixture in bell jar 7, maintaining the gases in a thoroughly mixed state.

To avoid unwanted deposition on the walls of bell jar 7, the temperature of these walls must be maintained well below the 1100 to 1200 degrees range. In this regard, bell jar 7 is desirably made of quartz, which is capable of withstanding relatively high temperatures and is also relatively transparent to the thermal radiation from heater 13. However, notwithstanding the transparency of bell jar 7, its temperature would eventually rise into the range which would cause unwanted deposition in the absence of a cooling system.

Accordingly, a blower 19 propels a high-volume stream of cooling air through its output duct 21 to cool apparatus 1. The cool air enters a lower input plenum chamber 23 and, via a bypass duct 25, an upper input plenum chamber 27. Chambers 23 and 27 are toroidal in configuration, and extend coaxially around the apparatus.

From upper plenum chamber 27 cooling air flows radially inward and downward along the axis of bell jar 7 to cool the bell jar. From lower plenum chamber 23, cooling air flows upwardly to enter the narrow region of space between the heater support 17 and the adjacent wall 29 of the apparatus, as indicated by arrow 31. As indicated in FIG. 1, arrow 31 extends upwardly through an aperture in the upper wall of plenum chamber 23. The upper wall of lower plenum chamber 23 is provided with a plurality of such apertures azimuthally spaced around chamber 23 to permit such upward flow of cooling air.

Air entering the region of space surrounding the heater 13 passes through slots in heater support 17 as indicated by arrow 33, cooling the heater lamps 15, their associated reflectors and heater support 17 itself. This cooling air then joins the air flowing downwardly from upper input plenum chamber 27 and enters a coaxial output plenum chamber 35.

From output plenum chamber 35, the heated exhaust air from apparatus 1 flows to an air-to-water heat exchanger 37, and returns to blower 19 via an input duct 39. The circulation of water through heat exchanger 37 has been indicated symbolically by arrows 41 in FIG. 1.

The cooling performance of the prior art apparatus 1 of FIG. 1 could be improved by eliminating the somewhat tortuous and complex portions of the air flow path, particularly within that portion of it extending from the lower input plenum chamber 23 to the output plenum chamber 35. Within this portion, the direction of air flow changes by 90 degrees to flow upwardly from chamber 23 through apertures into an isolated and narrow air space behind each of the separate heater banks (not shown) which form heater 13.

This air space is further constricted by electrical conductors (not shown) and water cooling lines (not shown) to the heater lamps 15, and these constrictions result in considerable pressure drops and nonuniformity of air flow through heater support 17. As a result, some of the heater lamps and their reflectors operate at too high a temperature, and the bell jar itself has axial regions in which the temperature exceeds 600 degrees Celsius.

Figure 2:
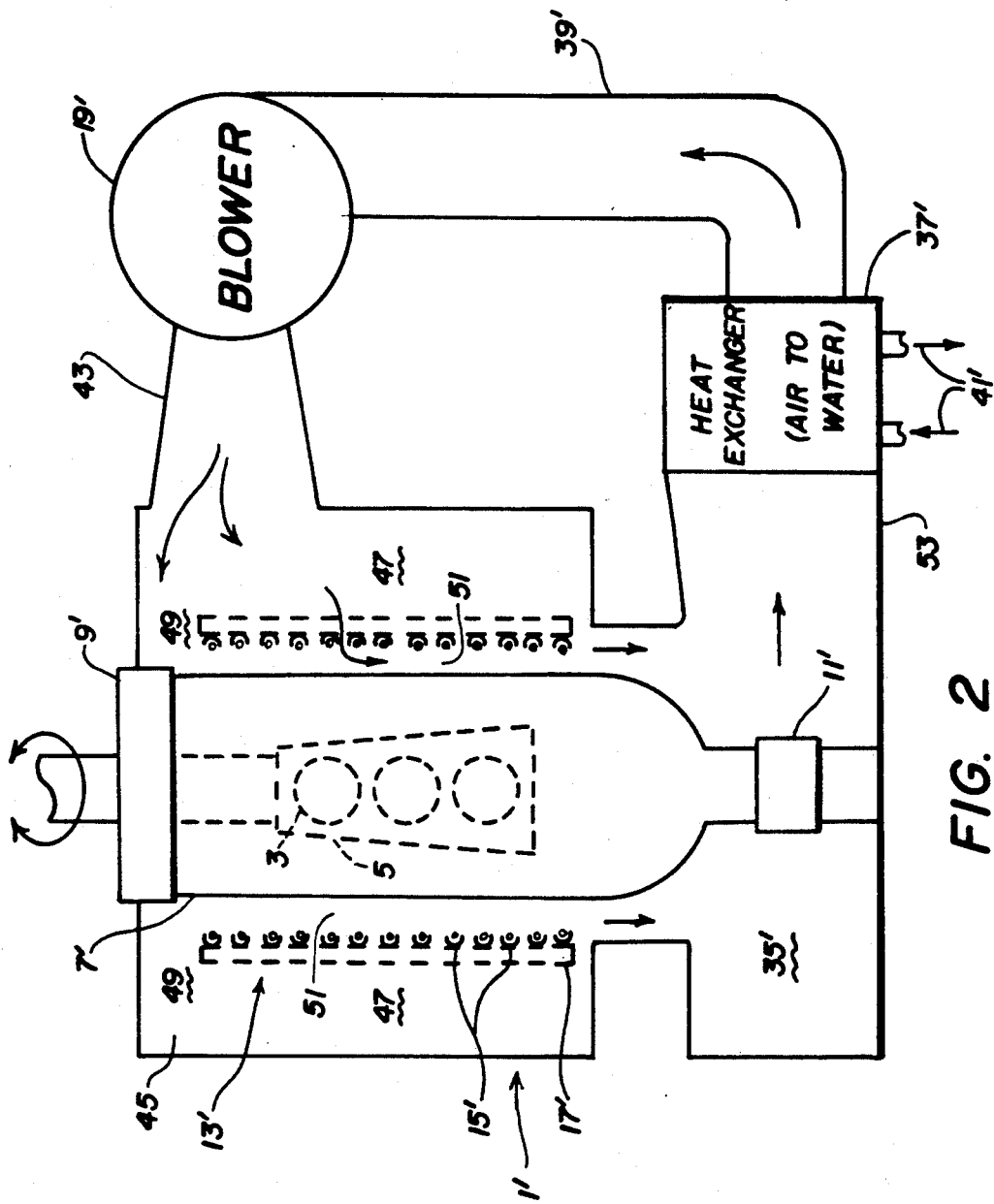
FIG. 2 is a cross-sectional view in schematic form of an epitaxial deposition apparatus according to the present invention.

In FIG. 2 an epitaxial deposition apparatus according to the present invention is illustrated using primed reference numerals to indicate parts which are similar to those already described with respect to FIG. 1. Thus, the apparatus 1' includes a bell jar 7' coaxially surrounded by a distributed radiant heater 13' formed of heating lamps 15' mounted on a heater support 17'. Similarly, an air cooling system including a blower 19' and an air-to-water heat exchanger 37' is provided.

However, in accordance with the present invention, the air flow path from the output of blower 19' through apparatus 1' and heat exchanger 37' has been designed to maximize both the magnitude and uniformity of air flow and to minimize air flow resistance. Accordingly, the system has been provided with a tapered input duct 43 connecting the output of blower 19' to the remainder of apparatus 1'. Each wall of duct 43 has a uniform taper of 7 degrees with respect to the axis of the duct. Such a taper provides an optimally smooth transition from the output of the blower to the remainder of the air flow system and minimizes air pressure drop in duct 43.

A large plenum chamber 45 extends coaxially around and spaced from heater 13' to define an outer coaxial cooling airspace 47 of sufficient volume to have a relatively uniform air pressure. Plenum chamber 45 also extends without interruption transversely across the top of apparatus 1' to form an end coaxial cooling airspace 49 which amply interconnects outer coaxial cooling airspace 47 with an inner coaxial cooling airspace 51 between bell jar 7' and heater 13'.

Cooling air from duct 43 enters plenum chamber 45 near the top end and flows generally downwardly through both coaxial cooling airspaces 47 and 51. Cooling air also flows radially inwardly through end cooling airspace 49 and through the slots in heater support 17' which make the heater transversely permeable to air flow.

From the lower end of inner coaxial airspace 51, the heated air flows into an output plenum chamber 35' and passes to an enlarged air-to-water heat exchanger 37' via a tapered output duct 53. Duct 53 is formed with a 7 degree wall taper as in the case of input duct 43 to minimize flow resistance.

A comparison of the air flow path of FIG. 2 with that of FIG. 1 shows that the flow pattern is much more unidirectional from the point where duct 43 brings cool air into apparatus 1' to the point where the heated air enters output plenum chamber 35'. In particular, the provision of a high-volume outer coaxial cooling airspace 47 ensures that nearly perfect pressure uniformity is obtained in the region surrounding heater 13'. Further, by making the end coaxial cooling airspace 49 in common with outer coaxial cooling airspace 47, the uniformity of pressure in airspace 49 is improved when compared with the small, isolated, upper plenum chamber 27 of FIG. 1.

As a result of these improvements in the air flow path, it has been found that a system constructed in accordance with FIG. 2 has bell jar temperature readings fully 200 Celsius degrees lower than a system constructed according to FIG. 1 when the two are operated at the same substrate temperature.

Figures 3, 3A, 3B:
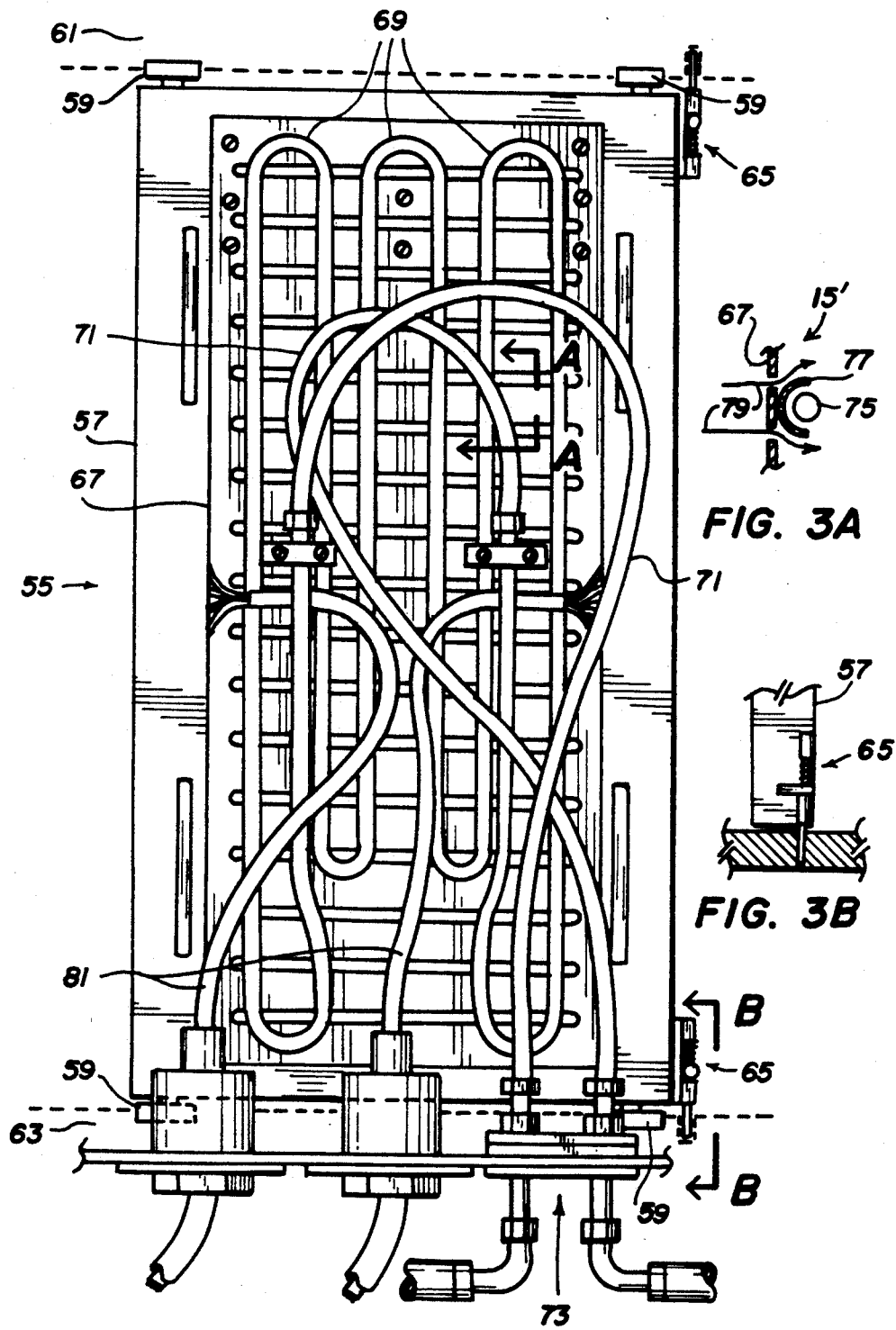
FIG. 3 is an elevational view of a lamp bank used in the apparatus of FIG. 2 according to the present invention.
FIGS. 3A and 3B are broken-away, detailed views of portions of FIG. 3 taken along lines A—A and B—B, respectively.

In FIG. 3, a radiant heater bank 55 according to the present invention is shown in a rear view corresponding to its appearance when seen in its operating position on the apparatus 1' of FIG. 2. In order to form the complete coaxially surrounding heater 13' of FIG. 2, five heater banks 55 are positioned coaxially around the bell jar 7' as will become more apparent from a consideration of FIGS. 4 and 5 as described below.

Heater bank 55 is formed as a planar panel having an outer rectangular support frame 57 which is mounted on the remainder of the apparatus 1' by means of four trunnions 59, one at each of the four corners of frame 57. Frame 57 is supported at its upper end by engaging the two trunnions 59 at this end in an upper support rail 61 which is illustrated schematically by a dotted line, and similarly at the lower end of frame 57, where a lower support rail 63 engages the lower two trunnions 59.

Figure 4:
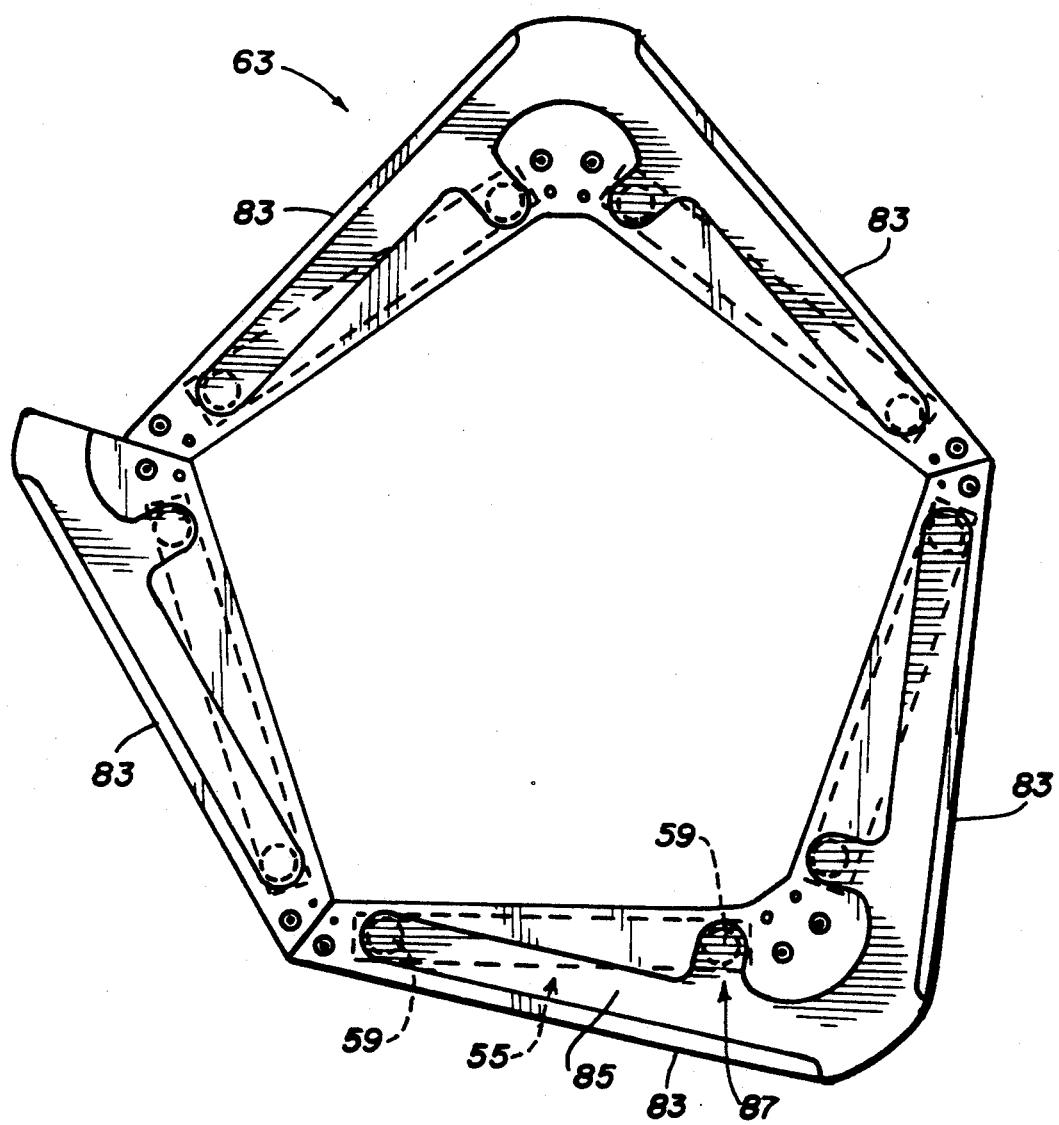
FIG. 4 is an elevational view of a support plate structure used to support lamp banks according to the present invention.
Figure 5:
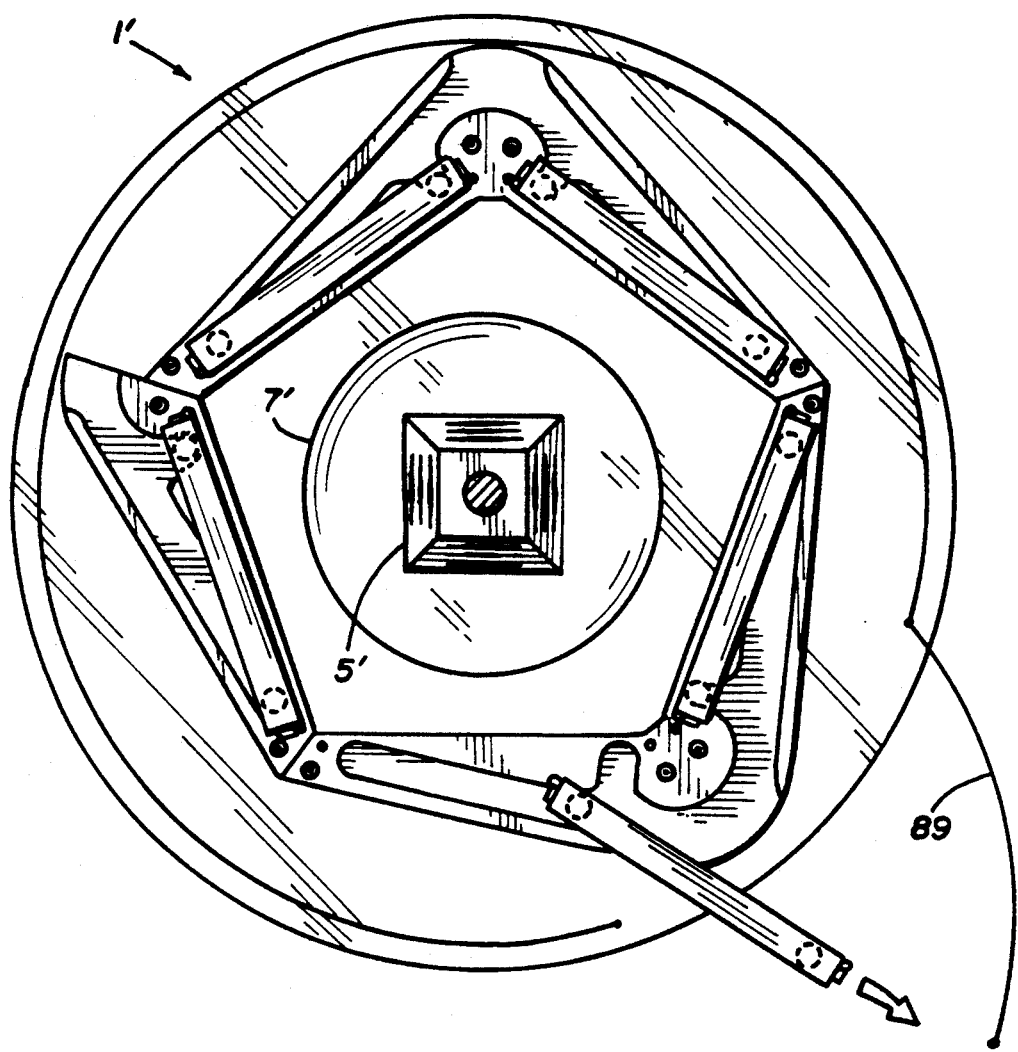
FIG. 5 is a top, transverse sectional view of an epitaxial deposition apparatus according to the present invention.

A spring-loaded locking bolt 65 is used at the top and bottom ends of frame 57 to secure it in engagement with upper and lower support rails 61 and 63 as will become clearer in consideration of the descriptions of FIGS. 4 and 5. Lower bolt 65 has been shown in detail in FIG. 3B, illustrating that it extends into a recess in lower support rail 63.

A slotted backer plate 67 spans the central opening in frame 57 and may be made of 0.125 inch copper, for example, such that it has excellent thermal conductivity. A serpentine cooling tube 69 extends over the surface of backer plate 67 for the purpose of carrying cooling water in close proximity to all regions of plate 67.

Tube 69 may be made of copper and may desirably be soldered or brazed to plate 67 over all of the region in which it contacts plate 67 for improved thermal conductivity. Flexible coolant tubes 71 connect the ends of tube 69 to a coolant water feedthrough 73 to permit connection to an external source of water (not shown).

FIG. 3A shows in cross section the relationship between backer plate 67 and the heater lamps 15' which are mounted on the front side (not shown) of bank 55 such that they face toward bell jar 7' in FIG. 2. Each lamp 15' consists of an elongated linear tubular halogen-quartz bulb 75 supported within a semi-cylindrical reflector 77. Although reflector 77 has been illustrated in FIG. 3 as circular in cross-section for the sake of simplicity, it will be understood that the actual cross-sectional shape of reflector 77 may be a parabola.

As illustrated by arrows 79, cooling air flows through the slots in slotted backer plate 67 and around the lamp reflector positioned between each pair of slots. The heat extracted in this way in addition to the heat extracted from plate 67 by the above-described water cooling system maintains the temperature of the lamps low enough to promote a satisfactory service life.

Electric power to supply each of the lamps 15' on bank 55 is supplied by a pair of multiconductor cables 81 which contain a pair of wires for each of the lamps 15' on bank 55. Connections to the lamp terminals (not shown) at the ends of each lamp are made by routing the wire pairs into the surrounding frame 57 as shown.

In FIGS. 4 and 5, the details of a support structure for each of five radiant heater banks of the type illustrated in FIG. 3 is shown. FIG. 4 illustrates in plan view the arrangement of lower support rail 63 of FIG. 3, and shows that rail 63 is actually formed of five grooved support plates 83. One heater bank 55 has been illustrated mounted in operating position in each of these support plates, using dotted lines. In the illustrated operating position, the two trunnions 59 at the lower end of each bank 55 occupy positions at the ends of two grooves in each plate 83, where they may be locked in position by locking bolts 65.

As is apparent in FIG. 4, the longer groove 85 is intersected by the shorter groove 87 in such a way that, with bolts 65 withdrawn from engagement with rail 63 and with coolant and electric service disconnected, banks 55 can be rotated away from the operating position about a pivot axis defined by the trunnion 59 at the end of groove 85. With the bank 55 rotated as far as possible, the panel 55 comes to rest in an open position (not illustrated) in which both trunnions 59 are within groove 85.

It will be noted that, in moving a bank 55 from its operating position to its open position, the trunnion at the end of groove 85 does not change its position and merely serves as a pivot point. Throughout the motion from operating position to open position, bank 55 remains fully supported and guided by contact of both of the trunnions 59 with the grooves 85 and 87.

In the open position, a bank 55 can be translationally moved along a translation axis coincident with groove 85 until one trunnion 59 has passed out of groove 85 as illustrated in FIG. 5. At this point bank 55 can be further rotated as convenient while still partially supported by the trunnion 59 remaining in groove 85. Further translational movement of bank 55 will move it to a release position in which both trunnions 59 are free from support rail 63, permitting the removal of the bank 55 from apparatus 1' through a movable or removable panel 89 for servicing.

In the embodiment of the invention illustrated in FIGS. 4 and 5, movement of a bank 55 from operating position into open position involves a rotation through a small angle of, for example, 15 degrees, sufficient to position both trunnions in groove 85 and permit translation therealong. However, it will be understood that by redesigning the support mechanism, it is possible to increase the angle of rotation between operating and open positions. For example, if each bank were to be swung outwardly at a 60 degree angle, servicing of the lamps could be carried out without removing the bank from the apparatus 1'.

Although the above description has discussed the mechanical relationship between each bank and lower support rail 63, it will be understood that upper support rail 61 is formed as a mirror image of lower support rail 61, such that the positions of the trunnions 59 at the upper end of each bank within the grooves of upper support rail 61 are the same as at the lower end of each bank. Accordingly, each bank is guided and support at both of its ends during the operations of removal and replacement. Since each bank may weigh approximately 30 pounds, such support, together with the ease of removing and replacing the banks greatly facilitates servicing the heater array when necessary.

Although this invention has been described with some particularity with respect to embodiments thereof which, taken together, comprise the best mode known to the inventors thereof for carrying out their invention, many changes could be made and many alternative embodiments could thus be derived without departing from the scope of the invention. Consequently, the scope of the invention is to be determined only from the following claims.

We claim:

1. An epitaxial deposition apparatus comprising in combination:

a reaction chamber for containing a semiconductor substrate supported on a susceptor and for confining a thermally activated reactive gas therewithin, said reaction chamber having at least a wall portion thereof made of a material which is substantially transparent to thermal radiation within a certain region of wavelengths;

a radiant heater bank for supplying thermal radiation within said certain region of wavelengths for heating said substrate and susceptor;

support means for: (1) supporting said radiant heater bank in a preselected fixed operating position in which said radiant heater bank radiates thermal radiation through said wall portion to heat said substrate and susceptor, and (2) supporting said heater bank in an open position in which said bank is pivoted away from said fixed operating position about a pivot axis lying generally parallel to one edge of said bank, said support means further comprising:

translational support means for: (1) permitting translational motion of said bank substantially without rotation of said bank, and constraining such translational motion along a translation axis from said open position to a release position in which said bank can be lifted free of remaining portions of the apparatus, and (2) continuously supporting said bank during translational motion between said open and released positions.

2. The apparatus of claim 1 wherein said support means comprises:

a pair of trunnions disposed on said radiant heater bank and defining said pivot axis extending therebetween, and;

trunnion-engagement means for engaging said pair of trunnions and for constraining motion of said heater bank between said fixed operating position and said open position to pivotal motion about said pivot axis.

3. The apparatus of claim 1 further including:

locking means for securing said bank in said fixed operating position, said locking means being selectively operable between a locked position in which said bank is locked in said fixed operating position and a released position in which said bank is movable away from said operating position to said open position.

4. The apparatus of claim 1 wherein said support means supports said bank continuously during motion between said operating and open positions.

5. The apparatus of claim 1 wherein said support means constrains motion of said heater bank between said fixed operating position and said open position to pivotal motion about said pivot axis.

6. The apparatus of claim 1 wherein said translation axis lies generally in the plane of said radiant heater bank.

7. An epitaxial deposition apparatus comprising in combination:

a reaction chamber for containing a semiconductor substrate supported on a susceptor and for confining a thermally activated reactive gas therewithin, said reaction chamber having at least a wall portion thereof made of a material which is substantially transparent to thermal radiation within a certain region of wavelengths;

a radiant heater array for supplying thermal radiation within said certain region of wavelengths for heating said substrate and susceptor, said heater array being distributed generally coaxially around and spaced from said reaction chamber to define an inner coaxial cooling airspace between said reaction chamber and said distributed radiant heater array, said heater array being radially air-permeable to permit a radial cooling air flow therethrough;

a plenum chamber extending in a generally continuous and unbroken manner, substantially free of intervening partitions, throughout the region: (1) generally coaxially around and spaced from said radiant heater array to define an outer coaxial cooling airspace between said plenum chamber and said radiant heater, and (2) generally transversely across and spaced from one end of said radiant heater array to form an end coaxial cooling airspace radially interconnecting said inner and outer coaxial cooling airspaces at said one end; and, an air-cooling means, having an inlet port for drawing in heated air and an outlet port for ejecting cool air, one of said ports being connected to said plenum chamber and the other of said ports being connected to said inner coaxial cooling airspace, for producing a flow of cooling air through said apparatus.

8. The apparatus of claim 7 wherein said air-cooling means comprises a closed-loop air-cooling system including:

an air-to-water heat exchanger coupled to said distal end of said inner coaxial airspace to receive heated air therefrom, said heat exchanger being also coupled to a source of cooling water; and, an air blower having an inlet coupled to said heat exchanger to draw cool air therefrom, and an outlet coupled to said plenum chamber to supply cool air thereto.

9. The apparatus of claim 8 further including a tapered duct interconnecting said blower outlet and said plenum chamber.

10. An epitaxial deposition apparatus comprising in combination:

a reaction chamber for containing a semiconductor substrate supported on a susceptor and for confining a thermally activated reactive gas therewithin, said reaction chamber having at least a wall portion thereof made of a material which is substantially transparent to thermal radiation within a certain region of wavelengths;

a radiant heater for supplying thermal radiation within said certain region of wavelengths for heating said substrate and susceptor, said heater being distributed generally coaxially around and spaced from said reaction chamber to define a first coaxial cooling airspace therebetween, said heater being radially air-permeable to permit a radial cooling air flow therethrough, said radiant heater including a radiant heater bank;

support means for: (1) supporting said radiant heater bank in a preselected fixed operating position in which said radiant heater bank radiates thermal radiation through said wall portion to heat said substrate and susceptor, and (2) supporting said heater bank in an open position in which said bank is pivoted away from said fixed operating position about a pivot axis lying generally parallel to one edge of said bank;

said support means further comprising:

translational support means for: (1) permitting translational motion of said bank substantially without rotation of said bank, and constraining such translational motion along a translation axis from said open position to a release position in which said bank can be lifted free of remaining portions of the apparatus, and (2) continuously supporting said bank during translational motion between said open and released positions;

a plenum chamber extending: (1) generally coaxial around and spaced from said radiant heater to define an outer coaxial cooling airspace therebetween, and (2) generally transversely across and spaced from one end of said radiant heater to form an end coaxial cooling airspace radially interconnecting said inner and outer coaxial cooling airspaces at said one end; and, an air-cooling means for: (1) introducing cool air into said plenum chamber proximal said one end and (2) exhausting heated air from said inner coaxial airspace at a distal end thereof, whereby cool air flows into said apparatus at said one end, axially along said inner and outer coaxial cooling airspaces, radially inward from said outer to said inner coaxial cooling airspace through said heater and out of said apparatus at said distal end of said inner coaxial airspace.

11. The apparatus of claim 10 wherein said support means supports said bank continuously during motion between said operating and open positions.

12. The apparatus of claim 10 wherein said support means constrains motion of said heater bank between said fixed operating position and said open position to pivotal motion about said pivot axis.

13. The apparatus of claim 10 wherein said air-cooling means comprises a closed-loop air-cooling system including:

an air-to-water heat exchanger coupled to said distal end of said inner coaxial airspace to receive heated air therefrom, said heat exchanger being also coupled to a source of cooling water; and, an air blower having an inlet coupled to said heat exchanger to draw cool air therefrom, and an outlet coupled to said plenum chamber to supply cool air thereto.

14. An apparatus for thermal processing of semiconductors comprising in combination:

a reaction chamber for containing a semiconductor substrate supported on a susceptor and for confining a thermally activated reactive gas therewithin, said reaction chamber having at least a wall portion thereof made of a material which is substantially transparent to thermal radiation within a certain region of wavelengths;

a radiant heater bank for supplying thermal radiation within said certain region of wavelengths for heating said substrate and susceptor;

support means for: (1) supporting said radiant heater bank in a preselected fixed operating position in which said radiant heater bank radiates thermal radiation through said wall portion to heat said substrate and susceptor, and (2) supporting said heater bank in an open position in which said bank is pivoted away from said fixed operating position about a pivot axis lying generally parallel to one edge of said bank, said support means further comprising:

translational support means for: (1) permitting translational motion of said bank substantially without rotation of said bank, and constraining such translational motion along a translation axis from said open position to a release position in which said bank can be lifted free of remaining portions of the apparatus, and (2) continuously supporting said bank during translational motion between said open and released positions.

15. An apparatus for thermal processing of semiconductors comprising in combination:

a reaction chamber for containing a semiconductor substrate supported on a susceptor and for confining a thermally activated reactive gas therewithin, said reaction chamber having at least a wall portion thereof made of a material which is substantially transparent to thermal radiation within a certain region of wavelengths;

a radiant heater array for supplying thermal radiation within said certain region of wavelengths for heating said substrate and susceptor, said heater array being distributed generally coaxially around and spaced from said reaction chamber to define an inner coaxial cooling airspace between said reaction chamber and said distributed radiant heater array, said heater array being radially air-permeable to permit a radial cooling air flow therethrough;

a plenum chamber extending in a generally continuous and unbroken manner, substantially free of intervening partitions, throughout the region: (1) generally coaxially around and spaced from said radiant heater array to define an outer coaxial cooling airspace between said plenum chamber and said radiant heater, and (2) generally transversely across and spaced from one end of said radiant heater array to form an end coaxial cooling airspace radially interconnecting said inner and outer coaxial cooling airspaces at said one end; and, an air-cooling means for: (1) introducing cool air into said plenum chamber proximal said one end and (2) exhausting heated air from said inner coaxial airspace at a distal end thereof, whereby cool air flows into said apparatus at said one end, axially along said inner and outer coaxial cooling airspaces, radially inward from said outer to said inner coaxial cooling airspace through said heater and out of said apparatus at said distal end of said inner coaxial airspace.

* * * * *